United States Patent
Kwon et al.

(10) Patent No.: US 8,558,120 B2
(45) Date of Patent: Oct. 15, 2013

(54) MULTILAYER BOARD FOR SUPPRESSING UNWANTED ELECTROMAGNETIC WAVES AND NOISE

(75) Inventors: Jong Hwa Kwon, Daejeon (KR); Dong-Uk Sim, Daejeon (KR); Sang Il Kwak, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 357 days.

(21) Appl. No.: 12/973,127

(22) Filed: Dec. 20, 2010

(65) Prior Publication Data

US 2011/0147063 A1 Jun. 23, 2011

(30) Foreign Application Priority Data

Dec. 21, 2009 (KR) ........................ 10-2009-0128317

(51) Int. Cl.
*H05K 1/16* (2006.01)

(52) U.S. Cl.
USPC ....................................................... 174/260

(58) Field of Classification Search
USPC ......... 174/260, 250, 251, 255, 256, 261, 262, 174/264, 265, 360, 376; 361/734, 738, 782, 361/818
See application file for complete search history.

(56) References Cited

U.S. PATENT DOCUMENTS

| | | | |
|---|---|---|---|
| 4,811,082 A * | 3/1989 | Jacobs et al. | 257/700 |
| 6,262,495 B1 | 7/2001 | Yablonovitch et al. | |
| 7,501,583 B2 * | 3/2009 | Chao et al. | 174/255 |
| 2005/0104678 A1 | 5/2005 | Shahparnia et al. | |
| 2005/0224912 A1 * | 10/2005 | Rogers et al. | 257/532 |
| 2007/0031590 A1 * | 2/2007 | Baniecki et al. | 427/79 |
| 2007/0090398 A1 | 4/2007 | McKinzie | |
| 2007/0285188 A1 | 12/2007 | Song et al. | |
| 2008/0266031 A1 * | 10/2008 | Uematsu et al. | 333/247 |
| 2009/0189713 A1 * | 7/2009 | Zhou | 333/181 |

FOREIGN PATENT DOCUMENTS

| | | |
|---|---|---|
| KR | 10-0723531 B1 | 5/2007 |
| KR | 2009-0081571 A | 7/2009 |
| KR | 2009-0089013 A | 8/2009 |

OTHER PUBLICATIONS

Dan Sievenpiper et al., "High-Impedance Electromagnetic Surfaces with a Forbidden Frequency Band", IEEE Trans. Microwave Theory Tech., vol. 47, No. 11, pp. 2059-2074, Nov. 1999.

Shahrooz Shahparnia et al., "Electromagnetic Interference (EMI) Reduction From Printed Circuit Boards (PCB) Using Electromagnetic Bandgap Structures", IEEE Trans. EMC, vol. 46, No. 4, pp. 580-586, Nov. 2004.

(Continued)

*Primary Examiner* — Jeremy Norris
*Assistant Examiner* — Tremesha S Willis
(74) *Attorney, Agent, or Firm* — Rabin & Berdo, P.C.

(57) ABSTRACT

A multilayer board for suppressing unwanted electromagnetic waves and noise includes: a power plane and a ground plane constituting a power distribution network; an electromagnetic wave suppression structure placed on the power plane or the ground plane; and a decoupling capacitor placed on the power plane or the ground plane, wherein the electromagnetic wave suppression structure and the decoupling capacitor are placed together.

10 Claims, 8 Drawing Sheets

(56) References Cited

OTHER PUBLICATIONS

Tzong-Lin Wu et al., "Electromagnetic Bandgap Power/Ground Planes for Wideband Suppression of Ground Bounce Noise and Radiated Emission in High-Speed Circuits", IEEE Trans. Microwave Theory Tech., vol. 53, No. 9, pp. 2935-2942, Sep. 2005.

Jong Hwa Kwon et al., "Partial EBG Structure with DeCap for Ultra-wideband Suppression of Simultaneous Switching Noise in a High-Speed System", ETRI Journal, vol. 32, No. 2, Apr. 2010, pp. 265-272.

Wenlong Zhu et al, "Study on EBG Structure Combined with Decoupling Capacitor for Suppressing Ground Bounce Noise", International Conference on Electronic Packaging Technology 7 & High Density Packaging (ICEPT-HDP), IEEE, Aug. 2009, pp. 335-338.

* cited by examiner

MULTILAYER BOARD FOR SUPPRESSING UNWANTED ELECTROMAGNETIC WAVES AND NOISE

CROSS-REFERENCE(S) TO RELATED APPLICATION(S)

The present invention claims priority of Korean Patent Application No. 10-2009-0128317, filed on Dec. 21, 2009, which is incorporated herein by reference.

FIELD OF THE INVENTION

The present invention relates to a technique for suppressing unwanted electromagnetic waves and noise generated in a multilayer board; and more particularly, to a multilayer board for suppressing unwanted electromagnetic waves and noise, by applying both decoupling capacitors (DeCaps) and an electromagnetic wave suppression structure including an electromagnetic bandgap (EBG) that are partially placed only at specific areas, such as in the vicinity of noise generating devices and/or noise-sensitive parts, on a power plane or ground plane in a multilayer board.

BACKGROUND OF THE INVENTION

Recently, as wired/wireless broadcasting and telecommunication-related technologies and services have been rapidly developed, and thus the level of users' demand for products has been increasing, advanced information communication equipment and systems are being equipped with various functions and becoming smaller in size so as to be easily carried. To implement this, high-speed digital systems are becoming faster and wider in bandwidth. As the clock frequency falls within the range of several GHz with such increase in the operating speed of the advanced equipment and systems, the problem of signal/power integrity and electromagnetic interference, which is caused by simultaneous switching noise (SSN) generated in a multilayer package or in a multilayer PCB structure, is considered as one of the most important issues in designing the chip/package and PCB of a high-speed system.

First, the multilayer PCB and package structure will be described. In the multilayer PCB and package structure, generally, a power plane and a ground plane constituting a power distribution network (PDN) are paired and placed inside the multilayer structure, which form a parallel plate waveguide configuration. Shown in FIG. 1 is a mechanism in which noise is generated in a PDN including power and ground planes due to layer arrangement, signal flow, and a high-speed switching device, such as an IC chip, in a multilayer PCB and package structure using a high-speed signal.

FIG. 1 is a view showing a signal flow and noise generation mechanism in a multilayer PCB and package structure using a high-speed signal.

Referring to FIG. 1, simultaneous switching noise (SSN) 102 is known to be the most serious noise in a multilayer PCB and chip/package structure. The SSN 102, also referred to as Delta-I noise or ground bounce noise (GBN), is generated by time-varying currents that change fast in a high-speed digital circuit. The SSN 102 generated between the power plane and a ground plane affects the signal/power integrity of the circuits and also causes unwanted electromagnetic interference (EMI) 104 to be radiated from the edges of a PCB board. Thus, the SSN 102 is becoming an important issue in high-speed digital systems operating at a low voltage level at a high-speed clock frequency.

A recent high-speed digital system has several hundreds of input/output gates for simultaneous switching. If a fast current flows through vias in the multilayer PCB/package due to simultaneous switching of the large number of gates, unwanted noise (SSN 102) is generated between the power plane and ground plane as shown in FIG. 1, and the generated SSN 102 is propagated across the PCB/package by a resonance mode of a parallel conducting plate and then unwanted EMI 104 is radiated from the edges of the PCB/package. That is, the SSN 102 is inductive noise generated when many output terminals of the digital circuit simultaneously switch. Since the amount of the SSN 102 depends on the configuration and current path of the PCB/package, it is difficult to measure a precise amount of the noise. However, the noise can be represented most simply by the following equation:

$$V_{noise} = N \cdot L_{eq} \frac{di}{dt} \qquad \text{Equation (1)}$$

wherein $V_{noise}$ is a noise voltage, N is the number of simultaneously switching gates, and $L_{eq}$ is an inductance value caused by current flowing through each driver during simultaneous switching.

So far, one of the most typical methods to solve the problem of signal/power integrity or EMI generated by SSN in analog and digital systems is to mount a device having a large capacitance, which is called a decoupling capacitor (DeCap), between the power layer and the ground layer. Research for eliminating a parasitic inductance component of the power distribution network (PDN) and properly supplying power to an integrated circuit device by the decoupling capacitor has been continuously conducted. However, the mounting of the DeCap on the PCB increases production costs, and also occupies the space of the PCB board, thus making the placement of various devices restrictive. Also, the parasitic inductance component of the DeCap may cause another parallel resonance frequency. Due to the parasitic inductance, the DeCap can operate only up to several hundreds of MHz, and thus the SSN having a GHz frequency component, which has become a problem in recent high-speed digital systems, cannot be eliminated.

The most frequently used method in efforts to reduce the parasitic inductance component of the DeCap is an embedded thin film capacitor that has a thin film material having a high dielectric constant disposed between power and ground planes. The use of the embedded thin film capacitor makes SSN reduction characteristic improve even in a higher frequency band than that of the DeCap. However, the embedded thin film capacitor also has a limited frequency band of several hundreds of MHz for use, and in order to put the embedded thin film capacitor to practical use, additional research on the composition of a material having a high dielectric constant and processing techniques using the same is required.

Besides, various methods, such as stitching vias, ground filling, and the like, have been proposed, but most of the methods are disadvantageous in that they operate locally in limited areas rather than across the substrate and show SSN suppression characteristics only in a narrow frequency band less than GHz, and thus it is known their effects are known to be insignificant in the current high-speed systems.

Meanwhile, new methods for solving the problems caused by SSN in a GHz band are being studied, and research is ongoing to reduce EMI by eliminating SSN in a chip/package and multilayer PCB structure and thus improving power integrity/signal integrity (PI/SI), by using an electromagnetic bandgap (EBG) structure highly applicable as an EMI reduction technique in a GHz band, that is, an EBG structure having a high impedance characteristic in a specific frequency band to provide a wide bandgap characteristic for currents flowing on surfaces. Reducing SSN by using an EBG in the multilayer PCB/package structure allows more effective PI/SI reduction and EMI suppression than using a DeCap or embedded thin film capacitor, and shows more excellent characteristics in selecting a frequency band to be suppressed.

However, a mushroom-type EBG structure formed in a double-layer structure has disadvantages that it is difficult to manufacture blind vias and the like in terms of process steps and additional costs are required. To overcome this problem, there has been suggested a single-plane EBG structure using periodic structure of an appropriate pattern on a ground plane or power plane. Although this structure can attain considerable noise reduction in a power distribution network (PDN) having a parallel plate waveguide configuration, it is disadvantageous in that it affects high-speed signals flowing over the ground/power planes to which the EBG structure is applied, and there is a limitation on the lowest frequency of a frequency band to be suppressed. Moreover, in case where an EBG structure is provided only on the ground plane or power plane, self-impedance at the region where the EBG structure is placed, especially in a low frequency band, increases, and thus the generation of unwanted electromagnetic waves becomes more dominant.

SUMMARY OF THE INVENTION

In view of the above, the present invention provides a multilayer board for suppressing unwanted electromagnetic waves and noise, which can apply both decoupling capacitors (DeCaps) and an electromagnetic wave suppression structure including an electromagnetic bandgap (EBG) that are partially placed only in specific areas, such as in the vicinity of noise generating devices and/or noise-sensitive parts, on a power plane or ground plane in a multilayer board.

Further, the present invention provides a multilayer board for suppressing unwanted electromagnetic waves and noise, which can widen a suppression frequency band from DC up to several tens of GHz (e.g., DC to 99 GHz) and minimize the effects on signals, while maintaining the characteristic of suppressing unwanted electromagnetic waves and noise, by disposing both an electromagnetic wave suppression structure and DeCaps, the electromagnetic wave suppression structure including an EBG used to suppress unwanted wideband electromagnetic waves or noise, such as SSN, generated in a multilayer board structure of electromagnetic devices and systems using a high-speed signal.

In accordance with the embodiment of the present invention, there is provided a multilayer board for suppressing unwanted electromagnetic waves and noise, including:

a power plane and a ground plane constituting a power distribution network;

an electromagnetic wave suppression structure placed on the power plane or the ground plane; and a decoupling capacitor placed on the power plane or the ground plane, wherein the electromagnetic wave suppression structure and the decoupling capacitor are placed together.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, the embodiment of the present invention will be described in detail with reference to the accompanying drawings which form a part hereof.

Figure 1:
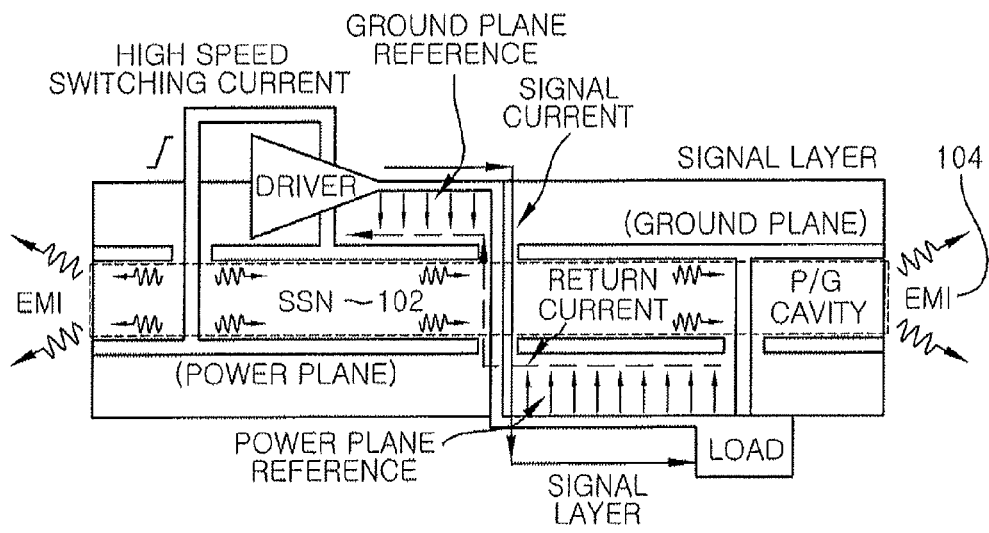
FIG. 1 is a view showing a signal flow and noise generation mechanism in a multilayer board structure using a high-speed signal.

FIG. 1 has illustrated a mechanism in which noise is generated, due to signal flow and a high speed switching device such as an IC chip, in a power distribution network (PDN) having a parallel plate waveguide shape and being composed of power and ground planes, in a multilayer printed circuit board (PCB) and package structure using a high-speed signal. As for a signal transmission path in the multilayer PCB and package structure of FIG. 1, a return current path is established not through the ground plane alone but along a path where the input impedance of each position becomes lower as the frequency of a signal increases. That is, it can be seen that, when a high-speed signal is used, both of the ground plane and the power plane are used as the return current path.

Figure 2A:
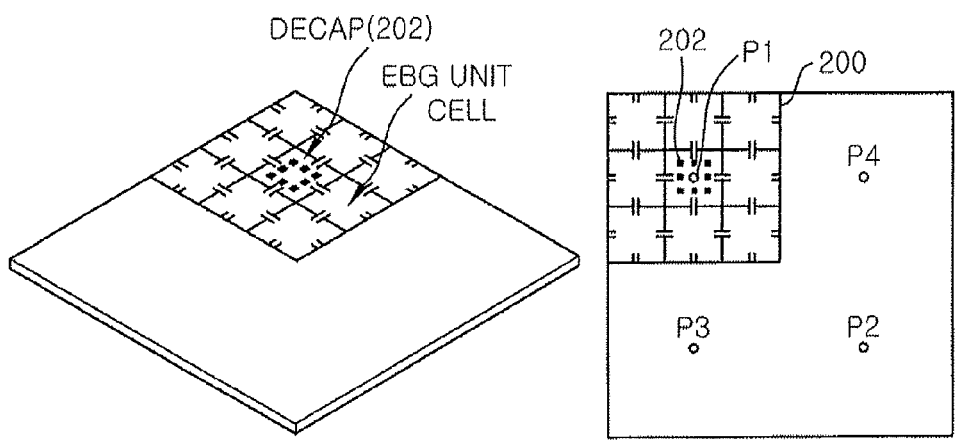
FIGS. 2A and 2B are views showing the placement of electromagnetic bandgap unit cells and a decoupling capacitor applied onto a single plane in accordance with an embodiment of the present invention.
Figure 2B:
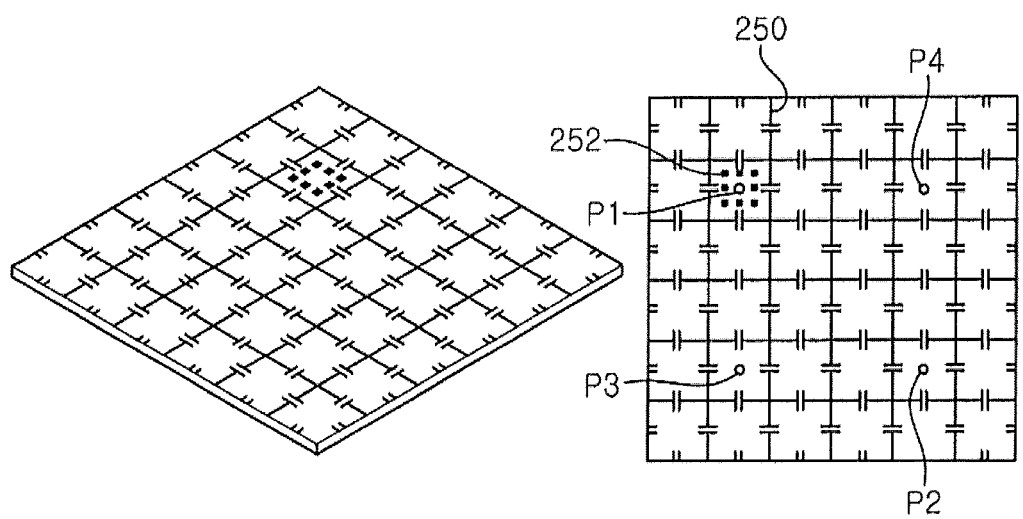

FIGS. 2A and 2B show structures of the PDN in which DeCaps and an electromagnetic wave suppression structure including EBG unit cells are arranged, in a multilayer board structure, in accordance with the embodiment of the present invention. Throughout the present invention, the multilayer board includes a multilayer PCB and a multilayer package board.

In FIG. 2A, a DeCap 202 and an electromagnetic wave suppression structure 200 are partially placed only in the vicinity of a noise source or noise-sensitive device on the power plane or ground plane. In FIG. 2B, for comparison of unwanted electromagnetic waves and noise suppression performance, an electromagnetic wave suppression structure 250 is fully placed across the power plane or ground plane of a PDN structure and a DeCap 252 is placed at the same position as the DeCap 202 of FIG. 2A.

In general, as the number of EBG structures having the same configuration increases, the electromagnetic wave suppression characteristics gets better but the frequency bandwidth to be suppressed is almost constant. Therefore, from an engineering point of view, once the suppression characteristics required for SSN reduction are determined, the number of EBG unit cells between an electromagnetic noise source and parts to be protected can be set.

Although different depending on EBG structure, at least two EBG unit cell structures are required in order to obtain suppression characteristics of more than about −30 dB. However, even if one EBG unit cell is placed in the vicinity of a noise source or a noise-sensitive device depending on a suppression frequency band or suppression level required for the system, unwanted electromagnetic waves and noise suppression characteristics can be obtained.

Moreover, the generation and transmission of unwanted electromagnetic waves can be suppressed even in a frequency band less than several hundreds of MHz by using the DeCap as well as by partially placing the electromagnetic wave suppression structure. P1 to P4 shown in FIGS. 2A and 2B are ports used in simulation or measurement in order to show the noise suppression characteristics of the electromagnetic wave suppression structure.

Figure 3:
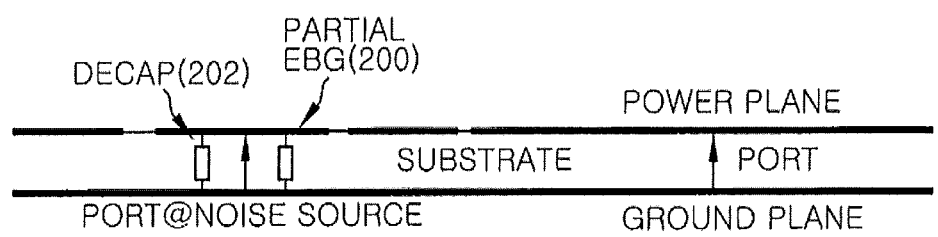
FIG. 3 shows a cross-sectional structure in a circuit model of a power plane and ground plane in which an electromagnetic bandgap structure and a decoupling capacitor structure are partially placed on a single plane in accordance with the embodiment of the present invention.

FIG. 3 shows a cross-sectional structure in a circuit model of power plane and ground plane in which an EBG structure 200 and a DeCap structure 202 are partially placed on a single plane as shown in FIG. 2A, in accordance with the embodiment of the present invention.

The present invention is intended to apply both an electromagnetic wave suppression structure and DeCap to power plane or ground plane structures used inside a multilayer board of three or more layers. Although FIG. 3 describes only the power and ground plane structures for convenience of explanation, the proposed unwanted electromagnetic waves and noise reduction structure is applicable to the power distribution network (PDN) including these power and ground planes. That is, the power plane and the ground plane are embedded in pairs even in a multilayer structure of three or more layers, and thus, the proposed structure is also applicable to the multilayer structure of three or more layers.

Figure 4:
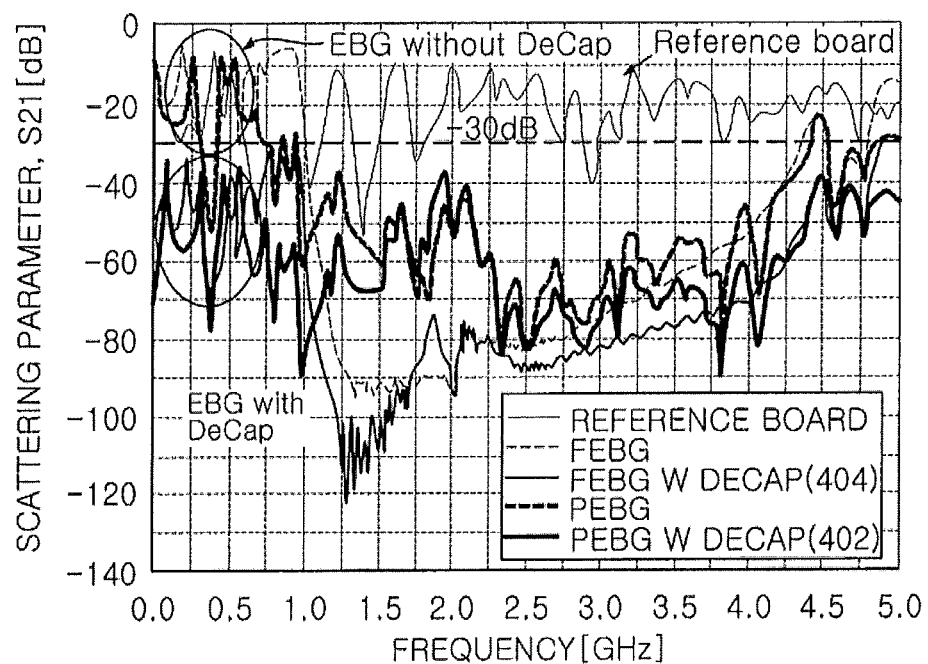
FIG. 4 is a graph showing comparison results of the noise suppression characteristics of the partially placed electromagnetic bandgap and decoupling capacitor structure in accordance with the embodiment of the present invention.

FIG. 4 is a graph showing comparison results of the noise suppression characteristics of the partially placed EBG and DeCap structure in accordance with the embodiment of the present invention, which shows the noise transmission and suppression characteristics of the EBG placement structure proposed in FIGS. 2A and 2B in the vicinity of the substrate (at positions P2 to P4) when P1 is assumed to be a noise source.

To exhibit the excellence of the noise suppression characteristics of the proposed structure, a simulation was conducted on the noise transmission characteristics in PCB boards having different configurations depending on the placement of an electromagnetic wave suppression structure and the presence or absence of a DeCap. Also, a simulation was conducted on a double-sided PCB only composed of a conductor of the same size, and the result (reference board) was indicated in FIG. 4.

As shown in FIG. 4, in case where both of the partially placed electromagnetic wave suppression structure and the DeCap are used, noise is sufficiently suppressed from DC to 5 GHz. That is, sufficient noise suppression characteristics can be obtained only by placing the EBG structure (PEBG w DeCap (402)) in a specific area without fully placing the EBG structure (FEBG w DeCap (404)) across the power/ground planes, and the DeCap can be used to suppress the unwanted noise at the lowest frequency range below the bandgap of EBG, which is the disadvantage of the exiting single-plane EBG structure, to be lowered to DC. Thus, it can be said that the EBG structure with DeCap (PEBG w DeCap (402)) can be sufficiently used as a suppression structure in the entire frequency band where noise may be generated. Moreover, the partially placed EBG structure can minimize the effects on the signals by properly placing a high-speed signal.

Figure 5:
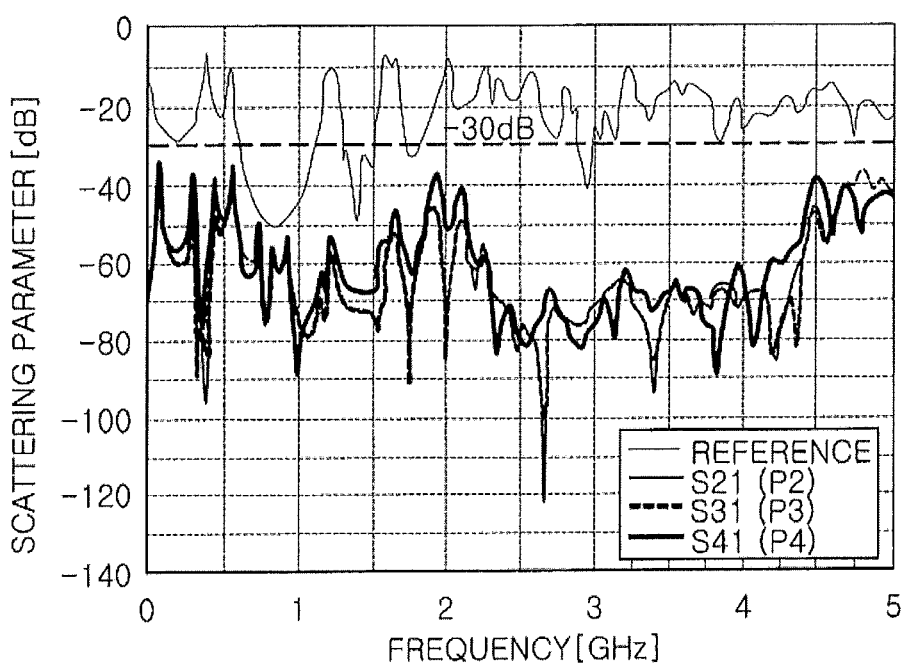
FIG. 5 is a graph showing the noise suppression characteristics of the partially placed electromagnetic bandgap and decoupling capacitor structure in accordance with the embodiment of the present invention.

FIG. 5 is a graph showing the noise suppression characteristics of the partially placed EBG and DeCap structure in accordance with the embodiment of the present invention, which shows the noise suppression characteristics of the unwanted electromagnetic waves and noise suppression structure proposed in FIGS. 2A and 2B in the vicinity of the substrate (at positions P2 to P4) when P1 is assumed to be a noise source.

Figure 6A:
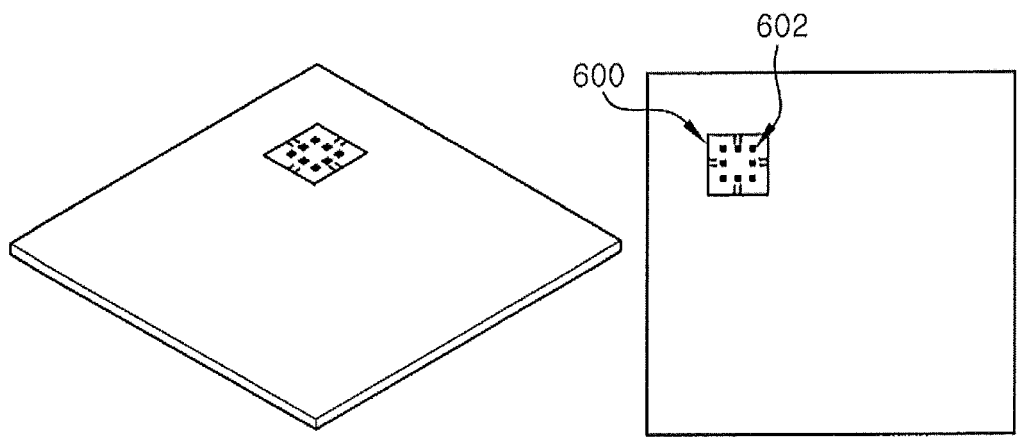
FIGS. 6A to 6C show a structure in which an electromagnetic wave suppression structure is partially applied only to the power plane and a decoupling capacitor is placed only in the vicinity of a noise generating source in accordance with the embodiment of the present invention.
Figure 6B:
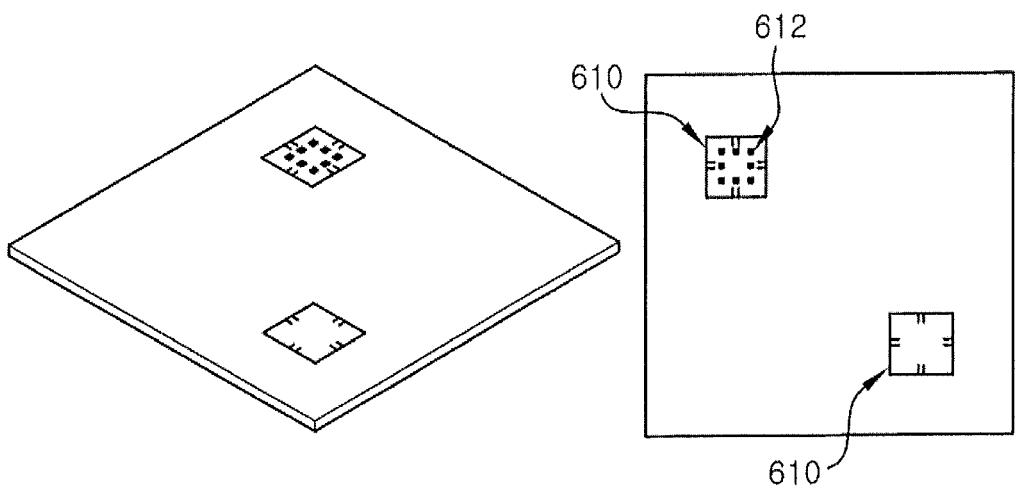
Figure 6C:
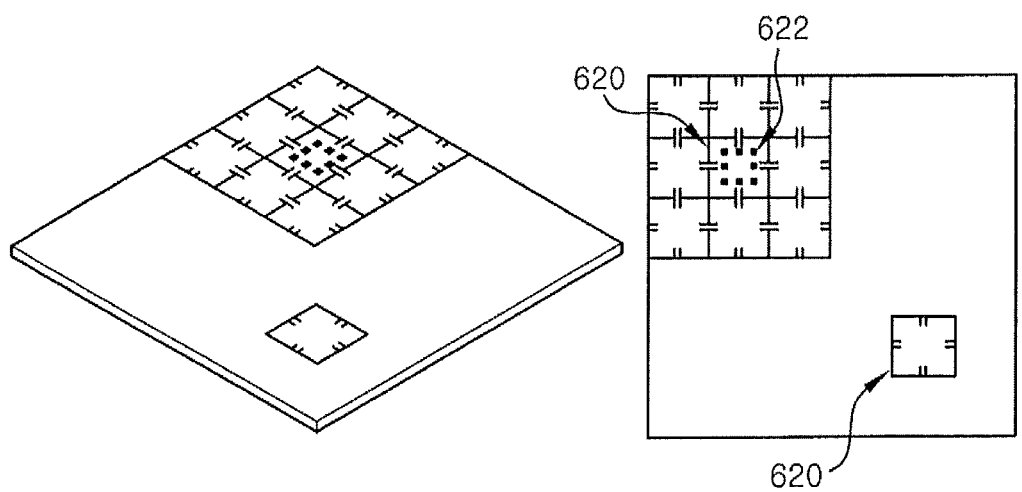

FIGS. 6A to 6C show a structure in which an electromagnetic wave suppression structure is partially applied to the power plane and DeCaps are placed only in the vicinity of a noise generating source in accordance with the embodiment of the present invention.

Referring to FIG. 6A, an electromagnetic wave suppression structure 600 and DeCaps 602 are placed together around a noise generating device in a power plane and ground plane structure. Referring to FIG. 6B, in case where a noise generating device and a noise-sensitive part co-exist in the power and ground plane structure, an electromagnetic wave suppression structure 610 and DeCaps 612 are partially placed together around the noise generating device and another electromagnetic wave suppression structure 610 is additionally placed in the vicinity of the noise-sensitive part.

Here, the electromagnetic wave suppression structures 610 separately placed in the two areas may have different electromagnetic wave suppression frequency bandwidths in order to widen the noise suppression frequency bandwidth.

Referring to FIG. 6C, in case where a noise generating device or noise-sensitive part is formed over a wide area, or the noise-sensitive part is spaced apart from the vicinity of the noise generating device, an electromagnetic wave suppression structure 620 that is partially placed together with a decoupling capacitor 622 in the vicinity of the noise generating device is formed over a wider area having more EBG unit cells than the electromagnetic wave suppression structure 610 in FIG. 6B is.

As shown in FIGS. 6A to 6C, the EBG structure is placed in the vicinity of an electromagnetic wave-sensitive device as well as a noise generating source, thereby improving a noise suppression effect on the corresponding areas. Moreover, although the EBG structure having the same configuration is applied in FIGS. 6A to 6C, an EBG structure having a different size or configuration may be used in order to widen the suppression frequency bandwidth.

As can be seen in FIG. 1, generally, not only the ground plane but also the power plane is often used as a return current path of high-speed signals. That is to say, since the EBG structure is partially applied, the power or ground plane to which the EBG structure is not applied can be used as the return current path of a main high-speed signal line.

Figure 7A:
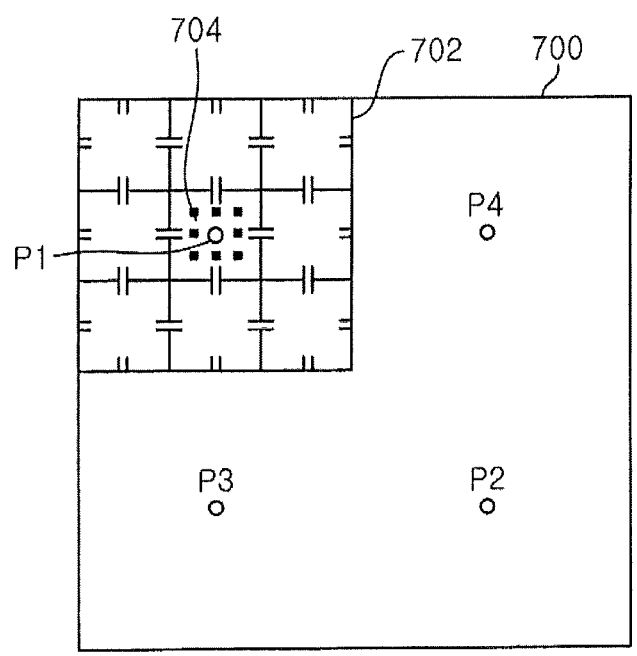
FIGS. 7A to 7C show an example of a structure in which an electromagnetic bandgap structure of a different size is partially applied to the ground plane and the power plane, and DeCaps are placed at specific positions around a noise generating source in accordance with the embodiment of the present invention.
Figure 7B:
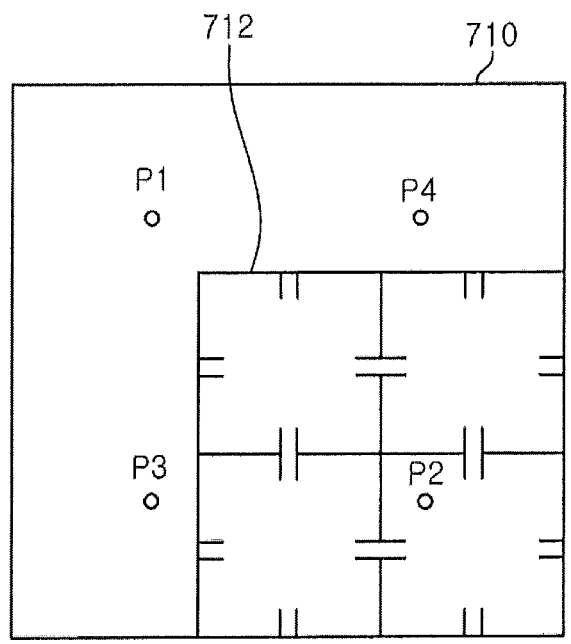
Figure 7C:
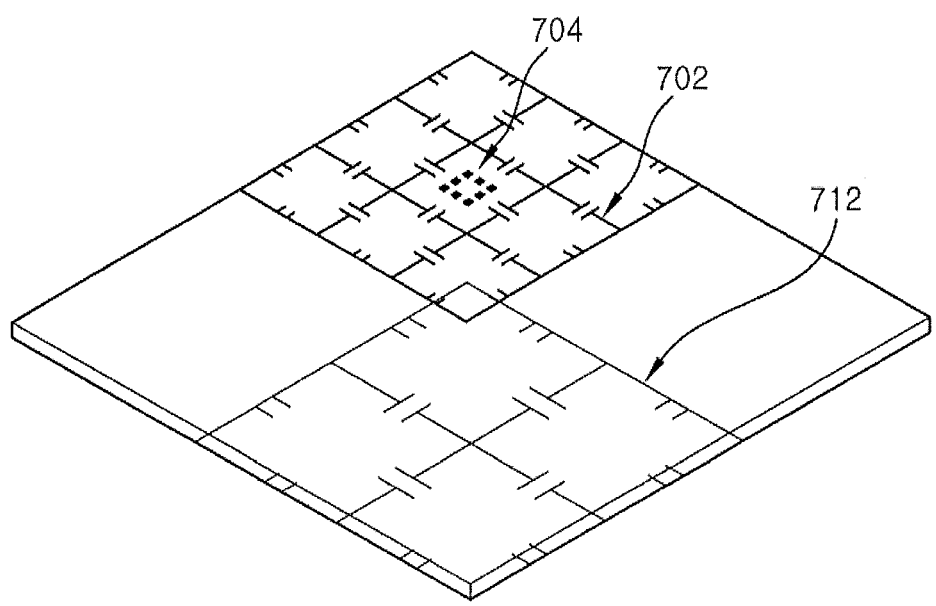

Based on this phenomenon, FIGS. 7A to 7C show an example of a structure in which an EBG structure of a different size is partially applied to the ground plane and the power plane, and DeCaps are placed at specific positions around a noise generating source in accordance with the embodiment of the present invention.

Referring to FIG. 7A, an electromagnetic wave suppression structure 702 and DeCaps 704 are partially placed together only around P1 where a noise generating source is assumed to be at P1 position. Referring to FIG. 7B, an electromagnetic wave suppression structure 712 is partially placed only around P2 where noise generating sources or noise sensitive devices are assumed to be at P2 position.

By this placement, as shown in FIG. 7C, the electromagnetic wave suppression structure 702 and the DeCap 704 are partially placed together on the ground plane 700, and the electromagnetic wave suppression structure 712 is partially placed on the power plane 710.

Meanwhile, the EBG unit cell structures, i.e., electromagnetic suppression structures 702 and 712, placed on the ground plane 700 and the power plane 710 may have different electromagnetic wave suppression frequency bandwidths in order to widen the noise suppression frequency bandwidth, and the electromagnetic wave suppression structures 702 and 712 may be fully placed across the ground plane 700 and the power plane 710 without being limited to the corresponding port where the noise generating sources and/or the noise sensitive devices are present.

Figure 8A:
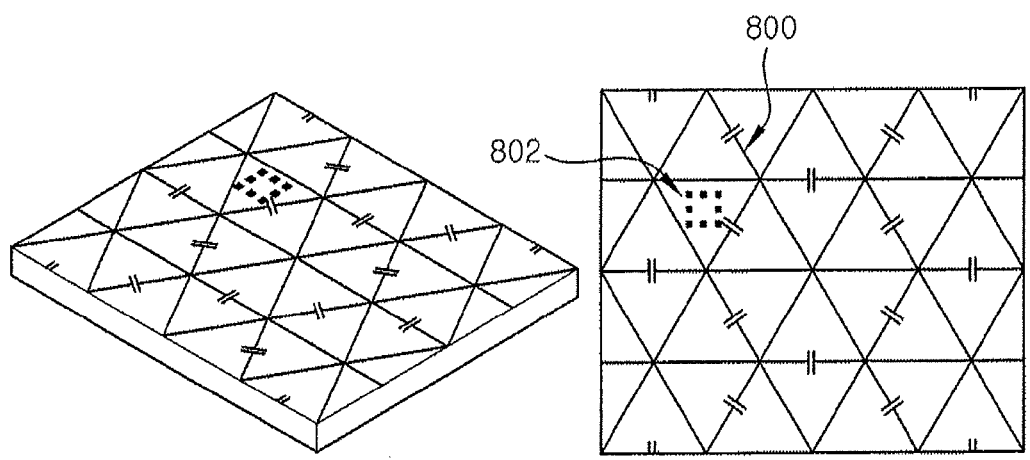
FIGS. 8A and 8B are views showing a triangular electromagnetic wave suppression structure and a decoupling capacitor placed only in the vicinity of a noise generating source in accordance with the embodiment of the present invention.
Figure 8B:
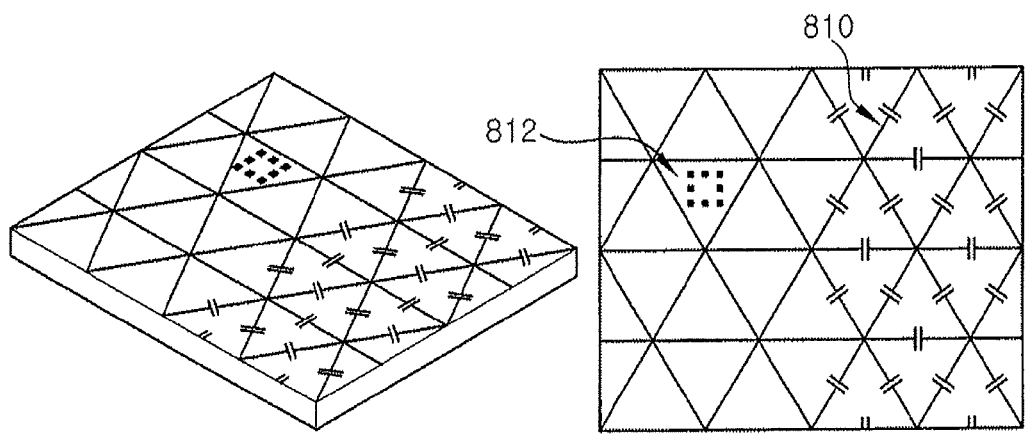

FIGS. 8A and 8B are views showing DeCaps placed only in the vicinity of a noise generating source and a triangular electromagnetic wave suppression structure in accordance with the embodiment of the present invention.

Referring to FIG. 8A, DeCaps 802 are placed at specific positions around a noise generating source and a triangular electromagnetic wave suppression structure 800 is fully applied across the power plane or the ground plane. Referring to FIG. 8B, DeCaps 812 are disposed at specific positions around a noise generating source and a triangle electromagnetic wave suppression structure 810 is partially applied to the power plane or the ground plane.

In this manner, the electromagnetic wave suppression structure can be implemented in the shape of various polygons, such as a rectangle, a square, a triangle, a lozenge depending on an implementation method of the EBG unit cells.

FIGS. 9A to 9F are views showing various methods of placing DeCaps in a multilayer board structure where an EBG structure is partially placed in accordance with the embodiment of the present invention.

It is seen throughout FIGS. 9A to 9F that an electromagnetic wave suppression structure and DeCaps are partially placed together only around P1 where the noise generating sources and/or the noise sensitive devices are present.

Figure 9A:
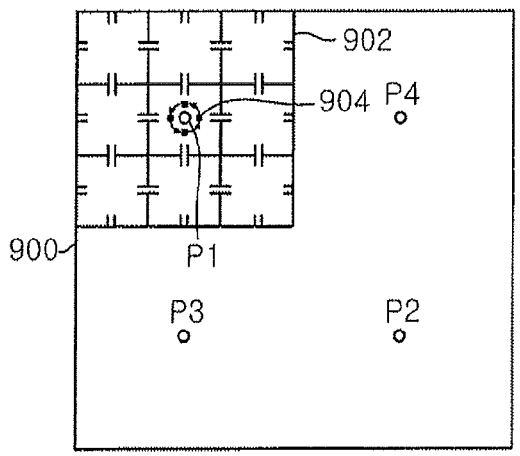
FIGS. 9A to 9F are views showing various methods of placing a decoupling capacitor in a multilayer board structure where a partially placed electromagnetic bandgap structure is applied in accordance with the embodiment of the present invention.

Referring to FIG. 9A, on a ground plane 900, an electromagnetic wave suppression structure 902 and a DeCap 904 are partially placed around P1, and the DeCap 904 may be placed at a certain point of the circumference having a radius equal to a preset distance from the port P1.

Figure 9B:
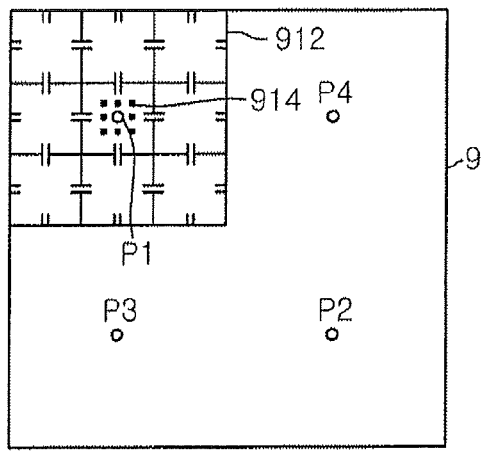
Figure 9C:
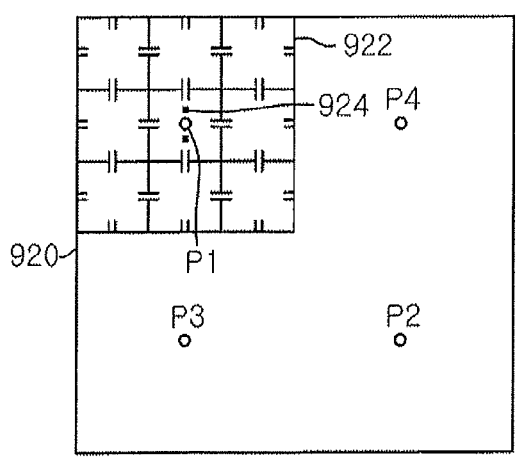
Figure 9D:
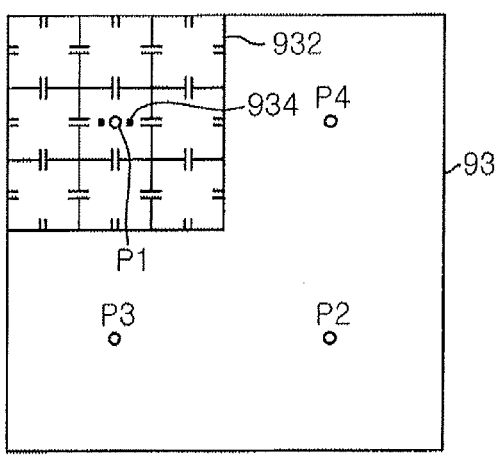

In FIG. 9B, on a ground plane 910, an electromagnetic wave suppression structure 912 and eight DeCaps 914 are partially placed around P1. FIG. 9C shows that on a ground plane 920, an electromagnetic wave suppression structure 922 and two DeCaps 924 are partially placed around P1, and herein, the two DeCaps 924 are placed above and below the port P1. In FIG. 9D, on a ground plane 930, an electromagnetic wave suppression structure 932 and two DeCaps 934 are partially placed around P1, and herein, the two DeCaps 934 are placed on the left and right of the port P1.

Figure 9E:
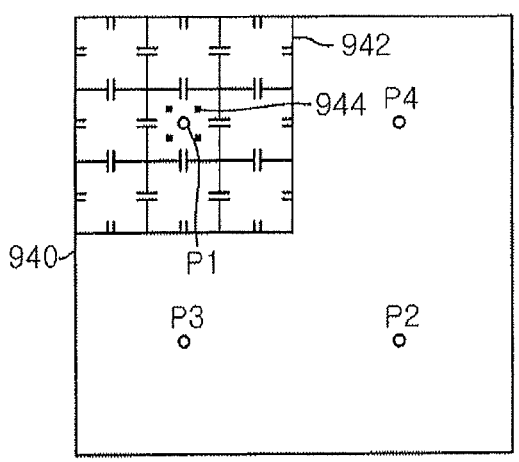
Figure 9F:
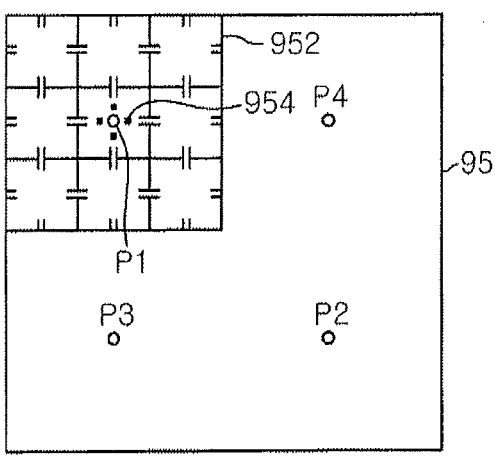

Referring to FIG. 9E, on a ground plane 940, an electromagnetic wave suppression structure 942 and four DeCaps 944 are partially placed around P1, and herein, the four DeCaps 944 are placed in a square shape with the port P1 as the center. Finally referring to FIG. 9F, on a ground plane 950, an electromagnetic wave suppression structure 952 and four DeCaps 954 are partially placed around P1, and herein, the four DeCaps 954 are placed above and below and on the left and right of the port P1.

Meanwhile, the DeCaps shown in FIGS. 9A to 9F, by adjusting capacitance magnitudes and positions, can control the unwanted electromagnetic waves and noise suppression frequency band and noise suppression level.

Therefore, the noise suppression characteristics can be optimized by selecting an optimum position in consideration of a frequency band to be suppressed, a noise suppression level, placement of parts on the substrate, and the like. Also, in order to adjust the unwanted electromagnetic waves and noise suppression frequency band and noise suppression level, an embedded DeCap having high dielectric constant and placed between the power plane and the ground plane can be used to increase the capacitance of the DeCap and reduce the parasitic inductance thereof.

As described above, the multilayer board for suppressing unwanted electromagnetic waves and noise in accordance with the embodiment of the present invention has some effects as follows.

First, unwanted wideband electromagnetic waves and noise generated in the multilayer board structure can be suppressed by DeCaps in a low frequency band and by a partially placed electromagnetic wave suppression structure in a frequency band more than several hundreds of MHz. As the electromagnetic wave suppression structure is partially placed in a specific area, a ground plane or power plane having no electromagnetic wave suppression structure applied thereto can be used as a return current path for high-speed signal lines while maintaining the noise suppression characteristics of the electromagnetic wave suppression structure, thereby improving signal characteristics of an entire system.

Moreover, noise generation can be reduced by reducing self-impedance by applying both DeCaps and an EBG structure to a noise generating source.

Further, it is possible to expand the suppression frequency bandwidth or properly adjust the noise suppression level by varying the shape or size of a partially placed electromagnetic wave suppression structure and the position and size of DeCaps. Therefore, an optimum noise suppression environment for performance improvement can be provided depending on the characteristics of a product to be applied.

While the invention has been shown and described with respect to the embodiments, it will be understood by those skilled in the art that various changes and modification may be made without departing from the scope of the invention as defined in the following claims.

What is claimed is:

1. A multilayer board for suppressing unwanted electromagnetic waves and noise, comprising:
   a power plane and a ground plane constituting a power distribution network;
   an electromagnetic wave suppression structure placed on the power plane or the ground plane; and
   a decoupling capacitor placed on the power plane or the ground plane, wherein the electromagnetic wave suppression structure and the decoupling capacitor are placed together, and wherein, in the electromagnetic wave suppression structure, an electromagnetic bandgap unit cell structure having a frequency band for suppressing the flow of electromagnetic waves or surface currents is implemented in a shape of one of a rectangle, a square, a triangle or a lozenge.

2. The multilayer board of claim 1, wherein the electromagnetic wave suppression structure is fully placed on the power plane or ground plane, or partially placed only in the vicinity of a noise generating device or a noise-sensitive part.

3. The multilayer board of claim 1, wherein the electromagnetic wave suppression structure and the decoupling capacitor are placed in the vicinity of a noise generating device or a noise-sensitive part on a part of the ground plane or the power plane of the multilayer board.

4. The multilayer board of claim 1, wherein the electromagnetic wave suppression structure and the decoupling capacitor are placed together in the vicinity of both a noise generating device and a noise-sensitive part on the ground plane or the power plane of the multilayer board.

5. The multilayer board of claim 1, wherein the decoupling capacitor is placed along with the electromagnetic wave suppression structure at a position close to a noise generating source or a noise-sensitive part on the ground plane or the power plane.

6. The multilayer board of claim 1, wherein a frequency band of the unwanted electromagnetic waves and a level of suppression of the noise is controlled by adjusting a capacitance magnitude and position of the decoupling capacitor.

7. The multilayer board of claim 1, wherein both of the electromagnetic wave suppression structure and the decoupling capacitor are placed on the power plane or the ground plane to thereby form a suppression frequency band from DC to several tens of GHz.

8. The multilayer board of claim 1, wherein the power plane or the ground plane, to which the electromagnetic wave suppression structure is not applied, is used as a return current path of a high-speed signal line.

9. The multilayer board of claim 1, wherein electromagnetic wave suppression structures having different electromagnetic wave suppression frequency bandwidths are placed on a part of the power plane or the ground plane.

10. The multilayer board of claim 1, wherein electromagnetic wave suppression structures having different electromagnetic wave suppression frequency bandwidths are placed across an entirety of the power plane and the ground plane, respectively.

* * * * *